US008624192B2

(12) United States Patent
Normand et al.

(10) Patent No.: US 8,624,192 B2
(45) Date of Patent: Jan. 7, 2014

(54) SYSTEM FOR CONTROLLING PHOTOMULTIPLIER GAIN DRIFT AND ASSOCIATED METHOD

(75) Inventors: Stéphane Normand, Mantes la Jolie (FR); Anne-Marie Frelin, Caen (FR); Hassen Hamrita, Palaiseau (FR); Vladimir Kondrasovs, Palaiseau (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 152 days.

(21) Appl. No.: 13/119,709

(22) PCT Filed: Sep. 22, 2009

(86) PCT No.: PCT/EP2009/062242
§ 371 (c)(1), (2), (4) Date: Mar. 17, 2011

(87) PCT Pub. No.: WO2010/034702
PCT Pub. Date: Apr. 1, 2010

(65) Prior Publication Data
US 2011/0186740 A1 Aug. 4, 2011

(30) Foreign Application Priority Data
Sep. 23, 2008 (FR) .................................... 08 56391

(51) Int. Cl.
*H03G 3/20* (2006.01)
*G01T 1/20* (2006.01)

(52) U.S. Cl.
USPC .................................. 250/362; 250/214 AG

(58) Field of Classification Search
USPC ........................................ 250/362, 214 AG
See application file for complete search history.

(56) References Cited

U.S. PATENT DOCUMENTS

| | | | | |
|---|---|---|---|---|
| 3,435,233 | A | 3/1969 | Farnsworth | |
| 3,644,740 | A | 2/1972 | Dobratz | |
| 4,272,677 | A * | 6/1981 | Berthold et al. | 250/252.1 |
| 4,712,010 | A * | 12/1987 | Alm | 250/334 |
| 7,352,840 | B1 | 4/2008 | Nagarkar | |
| 2005/0112654 | A1 | 5/2005 | Weiner | |
| 2008/0203304 | A1 * | 8/2008 | Fabris et al. | 250/336.1 |

FOREIGN PATENT DOCUMENTS

| | | | |
|---|---|---|---|
| EP | 0460696 | A | 12/1991 |
| FR | 1505015 | A | 12/1967 |

OTHER PUBLICATIONS

"Pulse-height spectrometry and Detection and Measurement, Counting Systems," p. 1-4, 2006, to Zimmerman.*
International Preliminary Examination Report dated Sep. 8, 2010 for PCT Application No. PCT/EP2009/062242.
International Search Report and Written Opinion dated Nov. 2, 2009 for PCT Application No. PCT/EP2009/062242.
Knoll, Glenn F., Radiation Detection and Measurement, 3rd ed., John Wiley & Sons, Inc., 2000.
Preliminary Search Report dated Jun. 4, 2009 for priority document FR 0856391.

* cited by examiner

*Primary Examiner* — David Porta
*Assistant Examiner* — Kenneth J Malkowski
(74) *Attorney, Agent, or Firm* — Knobbe Martens Olson & Bear LLP

(57) ABSTRACT

A system for controlling photomultiplier gain drift is disclosed. According to one aspect, the system includes first means for measuring a noise signal of the photomultiplier, the first means configured emit a measurement signal representative of the photomultiplier's noise signal. The system further includes second means for maintaining the measured noise signal at a constant level, based on the measurement signal. The disclosed embodiments apply to stabilization of the gain of photomultipliers and, more specifically, to stabilization of neutron measurement systems using photomultipliers.

10 Claims, 5 Drawing Sheets

SYSTEM FOR CONTROLLING PHOTOMULTIPLIER GAIN DRIFT AND ASSOCIATED METHOD

TECHNICAL FIELD AND BACKGROUND

The invention concerns a system for controlling photomultiplier gain drift and a method for controlling photomultiplier gain drift.

The invention applies to the stabilisation of the gain of a photomultiplier used for spectrometry measurements or photon counting measurements in the fields of nuclear measurement and medical measurement.

The invention also applies to the stabilisation of the neutron measurement systems using photomultipliers and also to the stabilisation of the gain of photomultipliers used in optical spectroscopy applications.

A photomultiplier is a device allowing photons to be detected. It takes the form of an electronic tube. Under the action of light electrons are torn away from a bi-alkali-metal by a photoelectric effect from a photocathode, and the weak electrical current generated in this manner is amplified by a series of dynodes using the phenomenon of secondary transmission to obtain a substantial gain. Such a detector enables the photons to be counted individually.

FIG. 1*a* shows a traditional photomultiplier. It consists of a glass vacuum tube 100 containing a photocathode 110, a focusing electrode 115, and "electron multiplier" consisting of a set of electrodes 120, called dynodes, and an anode 130. With reference to FIG. 1*a*, moving from left to right of the figure, each dynode is maintained at a potential value higher than the previous one. A photocathode is a material capable of converting electron radiation by secondary emission. The photomultiplier is coupled to a scintillator 140. A scintillator is a material which emits light photons after absorbing radiation.

The photomultiplier operates as will be described below. The scintillator 140 is illuminated, i.e. subject to radiation. Under the effect of this radiation the atoms of the material constituting the scintillator are "excited", i.e. the electrons move to a higher energy level. Incident photons 150 strike the material constituting the photocathode, the latter forms a fine layer deposited on the input window of the device. Electrons 117 are then produced by photoelectric effect. The electrons 117 are directed to the electron multiplier by the focusing electrode 115. The electrons 117 leave the photocathode with an energy equal to that of the incident photon, minus the operating energy of the photocathode 110. The electrons 117 are accelerated by the electric field and arrive at the first dynode with much higher energy, for example a few hundreds of electronvolts. When the electrons touch the dynode they cause a mechanism called secondary emission. An electron which arrives in this manner with an energy level of several hundred electronvolts generates several tens of electrons of a much lower energy level which, due to the difference of potential which exists between the first dynode and the second dynode, accelerate towards the second dynode, causing once again the same mechanism. By repeating this mechanism along the different stages of the dynode it is then possible to obtain, from the first 4 or 5 electrons emitted by the photocathode, several million electrons or more.

The structure of the sequence of dynodes is such that the number of electrons emitted constantly increases at each stage of the cascade. Finally, anode 130 is reached and the variation of charges generated in this manner over time creates a current pulse which marks the arrival of a photon at the cathode.

FIG. 1*b* represents a histogram illustrating the relationship between the useful signal and the noise in a photomultiplier. Axis x is the axis of the amplitudes of the pulses delivered by the photomultiplier and axis y is the axis of the quantity of pulses which are associated with the amplitudes of the pulses. Graph C1 represents the noise of the photomultiplier, and graph C2 represents the signal consisting of the useful signal and the noise signal. In FIG. 1*b*, it can be seen that there is a pertinent difference between the derivative of the graph comprising only the noise and the graph comprising the noise and the useful signal. This difference indicates the drift of the photomultiplier.

Photomultipliers are found very widely in measuring devices in the nuclear field and the medical field. The general characteristics of a photomultiplier make it a very efficient tool in terms of light/electrons conversion efficiency. However, intrinsically, photomultipliers have drifts relating to their intrinsic operation (temperature and ageing problems). These drifts are generally reflected by a change in the photomultiplier's general gain. Gain is the fundamental parameter describing the overall efficiency of the photomultiplier.

There are several known methods to stabilise the gain of a photomultiplier

Glenn F Knoll describes, in "Radiation Detection and Measurement" (ISBN 0-47-07338-5; John Willey & Sons, Inc) a system which uses an alpha emitting source installed within the scintillating material itself. The advantage of this method lies in the fact that the stabilisation is accomplished in relation to a radioactive-type measurement which, normally, is representative of that which is measured by the photomultiplier during its operation. A first disadvantage of such a system lies in the fact that the scintillating material ages significantly due to its being permanently exposed to the radiation and, as a consequence, the conversion efficiency between the energy deposited by the radiation and the quantity of light emitted by the scintillating material varies as the unit ages. Consequently, the peak monitoring generally made no longer enables the photomultiplier's gain to be corrected nominally. A second disadvantage is that, during low-level measurement, the fact of having a source present in the scintillator adds a background noise contribution which impairs the overall quality of the measurement.

Document U.S. Pat. No. 5,548,111 "Photomultiplier Having Gain Stabilisation Means" by Nurmi et al. describes a system which uses an LED electroluminescent diode in direct or pulsed mode to stabilise the photomultiplier's gain, in which the signal is detected at the cathode and at the anode. The gain is stabilised taking the quotient of the two signals at a constant value. The advantage of such a system is that, in this case, a non-radioactive system is used. A first disadvantage lies in the fact that the wavelength emitted by the LED is limited to a certain wavelength, and does not therefore enable the entire wavelength range to be covered. In addition, the temporal distribution corresponding to the emission of the scintillator is very different from that of the LED. A second disadvantage is that the coupling between the LED and the photomultiplier and the scintillator may pose problems of usage since this makes the construction more complex by adding elements. A third disadvantage lies in the fact that the quantity of photons emitted by the LED is not equal to that which is emitted by a scintillator. As an active system the LED is therefore itself subject to drifts which must be corrected. There is therefore a gain drift correction system which must itself be corrected and stabilised in terms of temperature, which undermines simplicity of use, and increases the sources of errors.

The system for controlling photomultiplier gain drift of the invention does not have the disadvantages mentioned above.

CERTAIN INVENTIVE ASPECTS

Indeed, one aspect of the invention concerns a system for controlling photomultiplier gain drift, where the system includes:

first means to measure a noise signal of the photomultiplier, and to output a measurement signal representative of the photomultiplier's noise signal; and second means to maintain, based on the measurement signal, the measured noise signal at a constant level.

The invention also concerns a method for controlling photomultiplier gain drift including a step of measuring a noise signal of the photomultiplier, to output a measurement signal representative of the photomultiplier's noise signal; and a step to maintain, based on the measurement signal, the measured noise signal at a constant level.

Another aspect relates to a method that stabilizes the gain of a photomultiplier by using properties intrinsic to the photomultiplier. The method of stabilisation according to the invention is advantageously based on the correlation existing between the noise internal to the photomultiplier and the gain of the photomultiplier.

BRIEF DESCRIPTION OF THE ILLUSTRATIONS

Other characteristics and advantages of the invention will appear on reading the embodiments of the invention made with reference to the attached figures, of which:

FIG. 1*a*, previously described, represents a photomultiplier according to the prior art;

FIG. 1*b*, previously described, represents a diagram illustrating the relationship between the signal and the noise in a photomultiplier;

FIG. 2*a* represents a system for controlling photomultiplier gain drift according to a first embodiment of the invention;

FIG. 2*b* represents various signals processed in a system in accordance with the system represented in FIG. 2*a;*

Figure 8A:
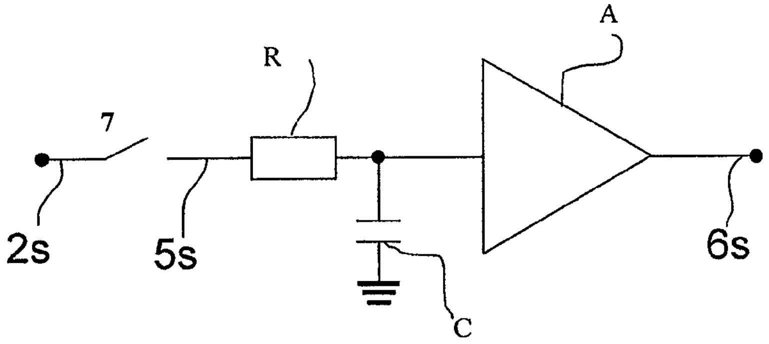
FIG.8a (Prior Art)
Figure 8B:
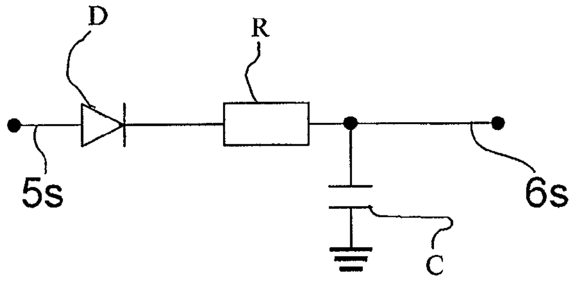

FIGS. 8*a* and 8*b* represent filters which may be used in systems for controlling photomultiplier gain drift of the invention.

In all the figures the same references designate the same elements.

DETAILED DESCRIPTION OF CERTAIN ILLUSTRATIVE EMBODIMENTS

Figure 2A:
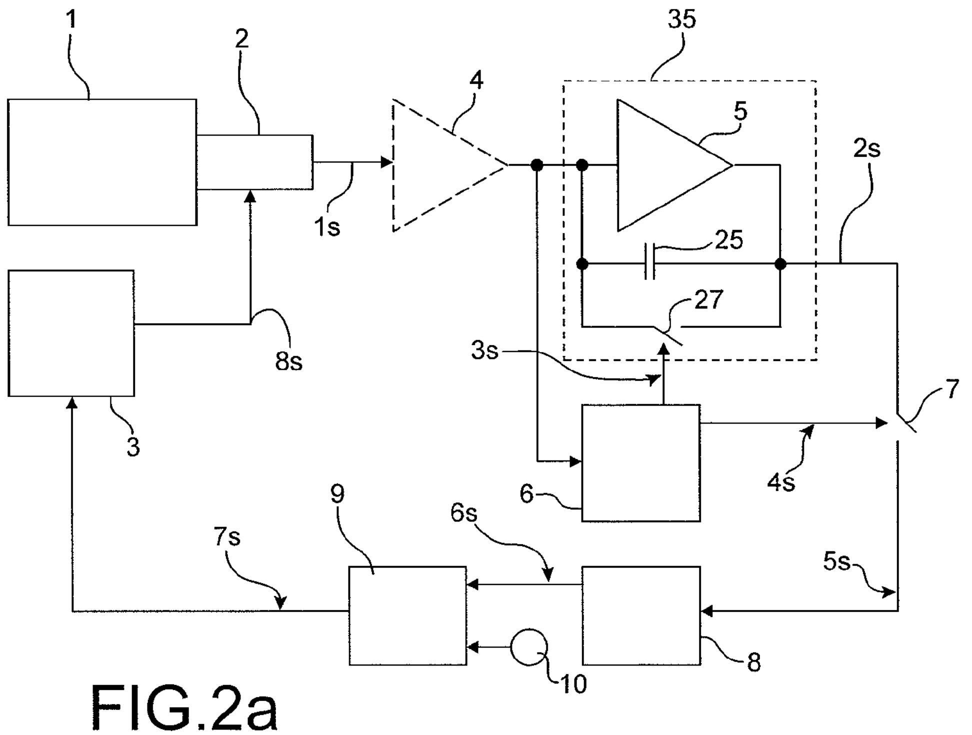

FIG. 2*a* represents a system for controlling photomultiplier gain according to a first embodiment of the invention.

Figure 7:
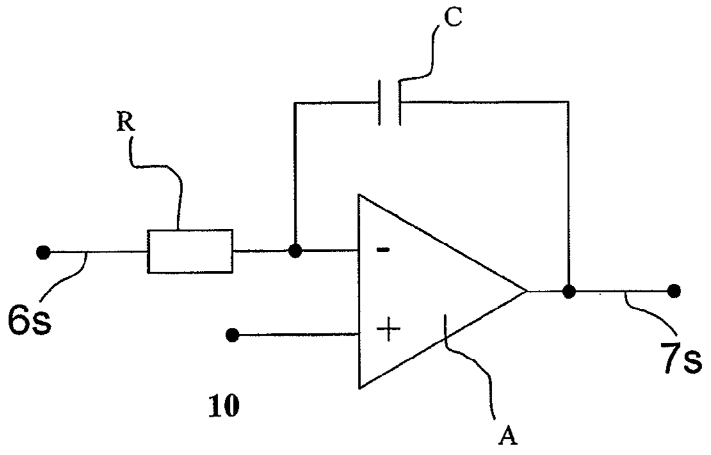
FIG. 7 represents an integrator used in variants of the invention.

A scintillator 1 has an output connected to the input of a photomultiplier 2 the output of which is connected, firstly, to a first integrator 35 including an amplifier 5 connected in parallel to a condenser 25 and to a first switch 27 and, secondly, to a discriminator 6. In a particular embodiment (a case in which the photomultiplier does not output a signal of sufficiently high level) a preamplifier 4 is installed at the output of the photomultiplier such that it is then the output of the preamplifier 4 which is connected to the first integrator 35 and to the discriminator 6. The discriminator 6 drives the first switch 27 and a second switch 7, the input of which is connected to the output of the first integrator 35, and the output of which is connected to the input of a filter 8. The output of the filter 8 is connected to a first input of a second integrator 9. An example of an integrator which can be used in this embodiment is illustrated in FIG. 7 and will be described in due course. A reference voltage 10 is connected to a second input of the second integrator 9. The second integrator 9 has its output connected to the input of an adjustable high-voltage device 3 which is known in the art and the output of which is connected to a voltage control input of the photomultiplier 2. The function of device 3 is to provide the photomultiplier 2 with a high voltage in accordance with the signal emitted at the output of the second integrator 9 and, as a consequence, to adjust the total gain of the photomultiplier by altering the high voltage and the various dynodes of the tube in accordance with the result of the signal analysis by the previously described system.

Figure 2B:
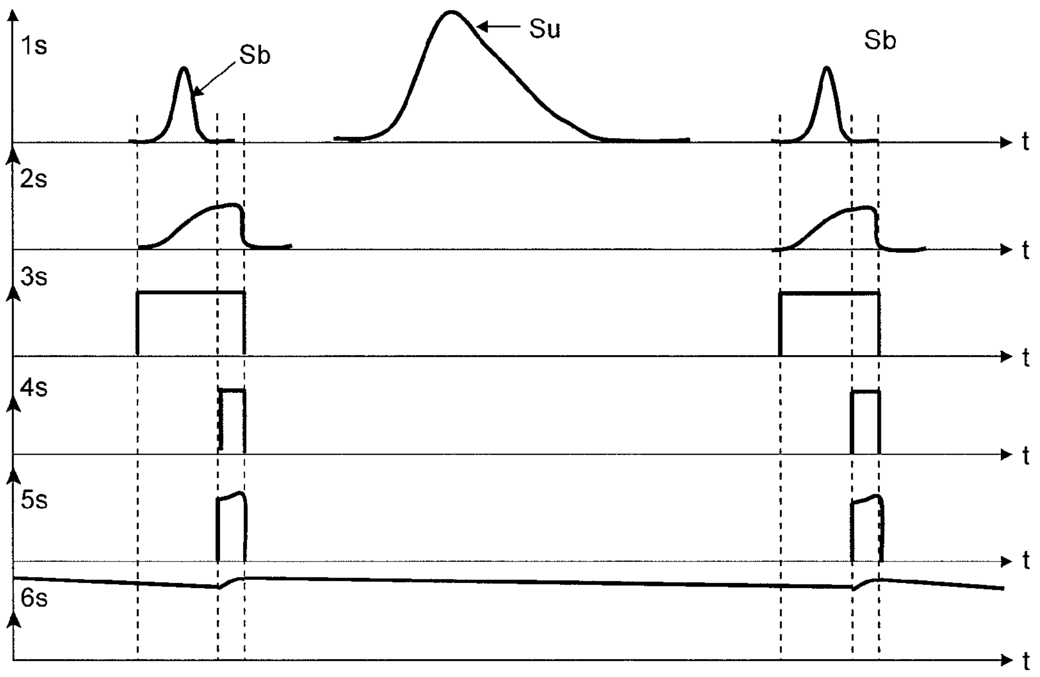

FIG. 2*b* represents various signals 1*s*-7*s* which are processed in a device in accordance with the device of FIG. 2*a*.

In operation, when the photomultiplier is activated, a first signal 1*s*, comprising the useful signal Su emitted from the scintillator 1 and the noise signal Sb originating from the photomultiplier, is transmitted simultaneously at the input of the first integrator 35 and at the input of the discriminator 6. The discriminator 6 measures, in a manner known per se, the amplitude and duration of the pulses output from the photomultiplier. The discriminator 6 can be activated either by means of a clock signal predefined by the user (not represented in the figure), or by means of the photomultiplier output signal. The discriminator 6 simultaneously sends a logic signal 3*s* to the first switch 27 belonging to the integrator 35, and a logic signal 4*s* to the second switch 7. The function of the logic signal 3*s* is to close the first switch 27 (activation of the first integrator 35), and the function of the logic signal 4*s* is to close the second electronic switch 7. The first integrator 35 integrates the noise pulses in order to obtain the area of each pulse, i.e. in order to obtain the energy of each noise signal. According to the integration operation, the first switch 35 sends an integrated output signal 2*s* to the second electronic switch 7. The amplitude of the signal 2*s* is then proportional to the energy of the noise signals. When the second electronic switch 7 is in the on-state, a fifth analog signal 5*s* originating from the first integrator is sent to the filter 8. The filter 8 determines the amplitudes of the signal 5*s* originating from the first integrator 5 and sends a sixth filtered signal 6*s* to the second integrator 9. The sixth signal 6*s* is dependent on the amplitude. The sixth signal 6*s* can be analog or digital. The second integrator 9 integrates the difference between the signal 6*s* and the reference voltage 10, where the sixth signal 6*s* depends on the photomultiplier's intrinsic noise. Integrator 9 compares the amplitude of the sixth signal 6*s* with the reference voltage 10. Depending on the result of this comparison, the integrator 9 integrates the difference between its two inputs and generates a seventh signal 7*s* of constant value. The seventh signal 7*s* is provided at the input of device 3 and its function is to indicate to device 3 the voltage to be applied to the control of photomultiplier 2.

The drift of the photomultiplier is stabilised by controlling the intrinsic noise Sb of the photomultiplier 2. In a first step, the noise Sb is separated from the useful signal Su. In a second step the intrinsic noise of the photomultiplier is measured. After this, in a third step, this noise is stabilised at a constant value.

Figure 3:
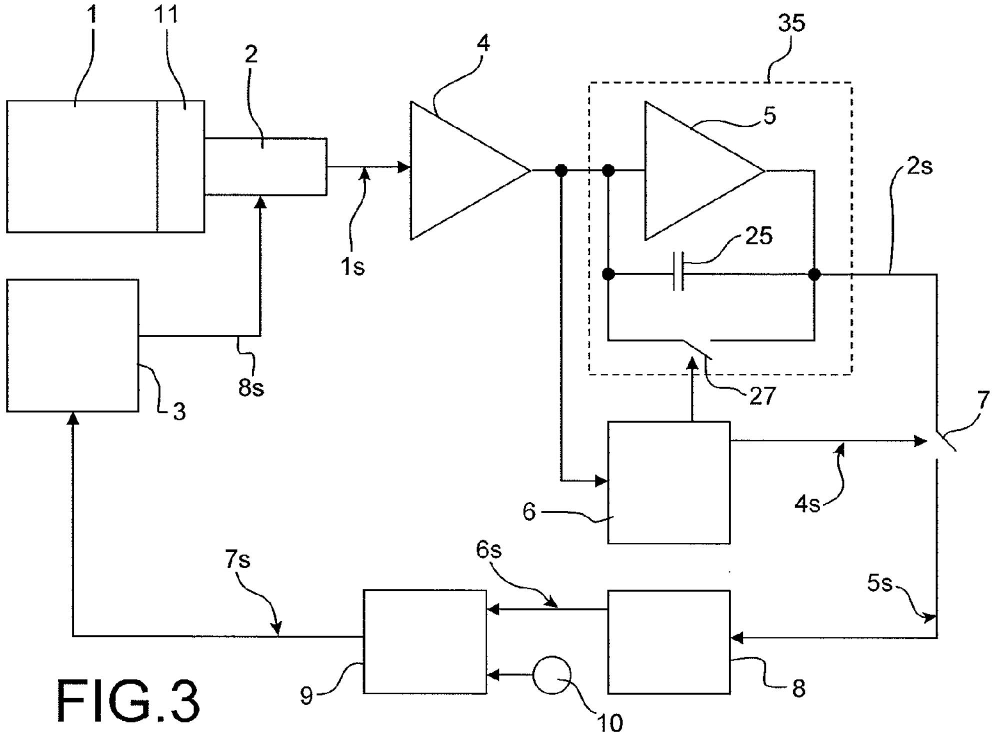
FIG. 3 represents a system for controlling photomultiplier gain drift according to a variant of the first embodiment of the invention.

FIG. 3 shows a variant of the first embodiment of the invention.

This variant differs from the embodiment of the invention represented in FIG. 2*a* by the presence of an optical pulse stretcher 11 located between the scintillator 1 and the photomultiplier 2. The output of the scintillator 1 is connected to the input of the optical stretcher 11, the output of which is connected to the input of the photomultiplier 2. The optical stretcher 11 includes a material suitable for temporally stretching the light pulses emitted by the scintillator. The presence of an optical stretcher is necessary in the case of very fast scintillating material, the temporal performance of which leads to useful signal shapes comparable to the noise signals. The optical stretcher then causes a modification of the temporal distribution of the photons which facilitates the separation of the useful light pulse and of the noise signals.

Figure 4:
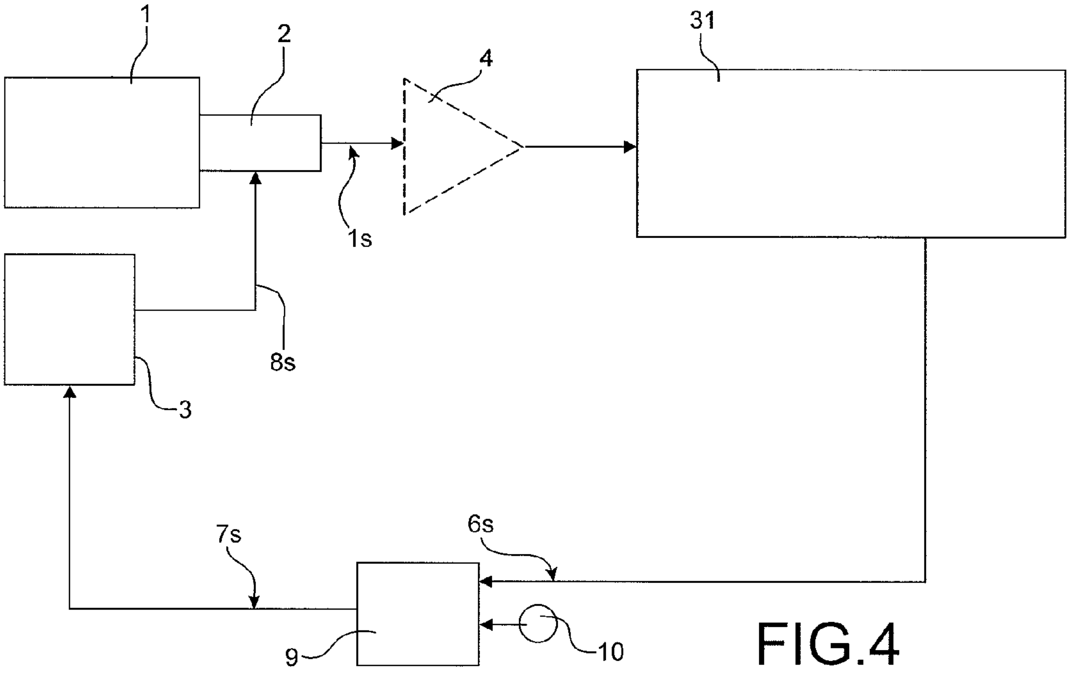
FIG. 4 represents a system for controlling photomultiplier gain drift according to a second embodiment of the invention.

FIG. 4 represents a system for controlling photomultiplier gain drift according to a second embodiment of the invention.

The output of the scintillator 1 is connected to the input of the photomultiplier 2 the output of which is connected to the input of an amplitude spectrometer 31, which is also connected to a first input of an integrator 9, a second input of which is connected to a reference voltage 10. As above, in a particular embodiment in which the photomultiplier does not emit a signal of a sufficiently high level, a preamplifier 4 is placed between the output of the photomultiplier and the input of the spectrometer 31. The integrator 9 has its output connected to the input of an adjustable high-voltage device 3 the output of which is connected to a voltage control input of the photomultiplier 2.

Figure 1A:
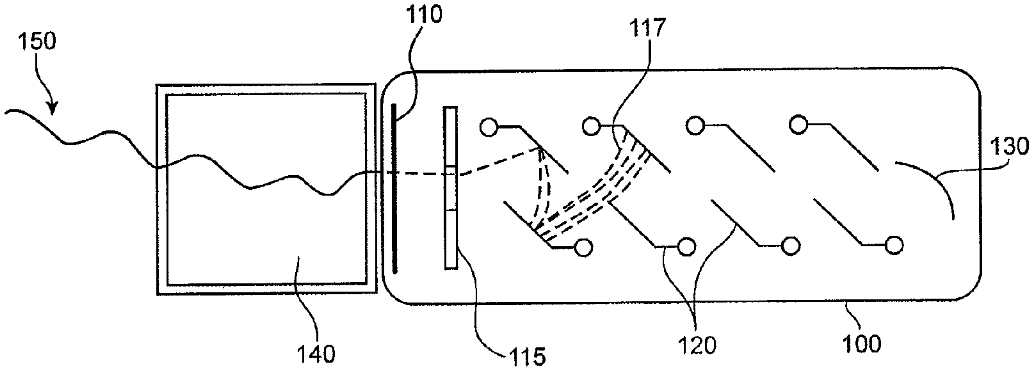
FIG.1a (Prior Art)
Figure 1B:
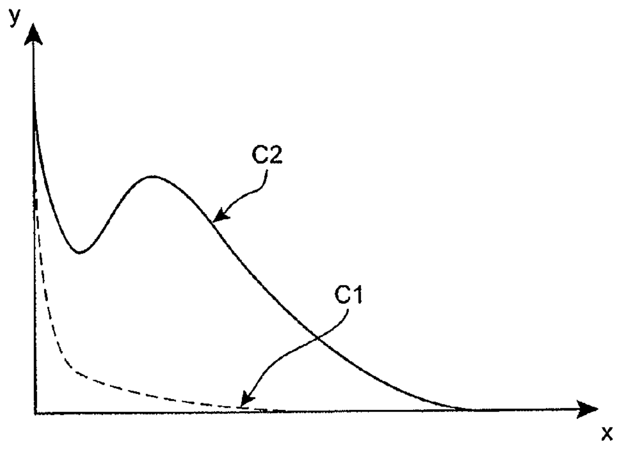
FIG.1b (Prior Art)

In operation, when the photomultiplier is activated, a first signal is sent from the photomultiplier 2 to the amplitude spectrometer 31. The analysis of the spectrum by the amplitude spectrometer 31 in the region of the low amplitudes (region of the noise pulses, cf. FIG. 1*b*), consists, through a calculation of decrease of the observed spectrum, in splitting the distribution of the amplitudes. Given that the amplitude decrease of the spectrum in this region depends on the distribution of the amplitudes of the noise signals generated by the photomultiplier, and that the distribution of the noise signals' amplitudes also depends on the gain of the photomultiplier 2, stabilising the decrease in this region enables the photomultiplier's gain to be stabilised. After analysis of the spectrum in the low-amplitude region, the spectrometer 31 sends a sixth signal 6*s*, either digital or analog, having a voltage proportional to the decrease in the noise region, to the integrator 9. The remainder of the circuit operates as described above, with reference to FIG. 2*a*.

Figure 5:
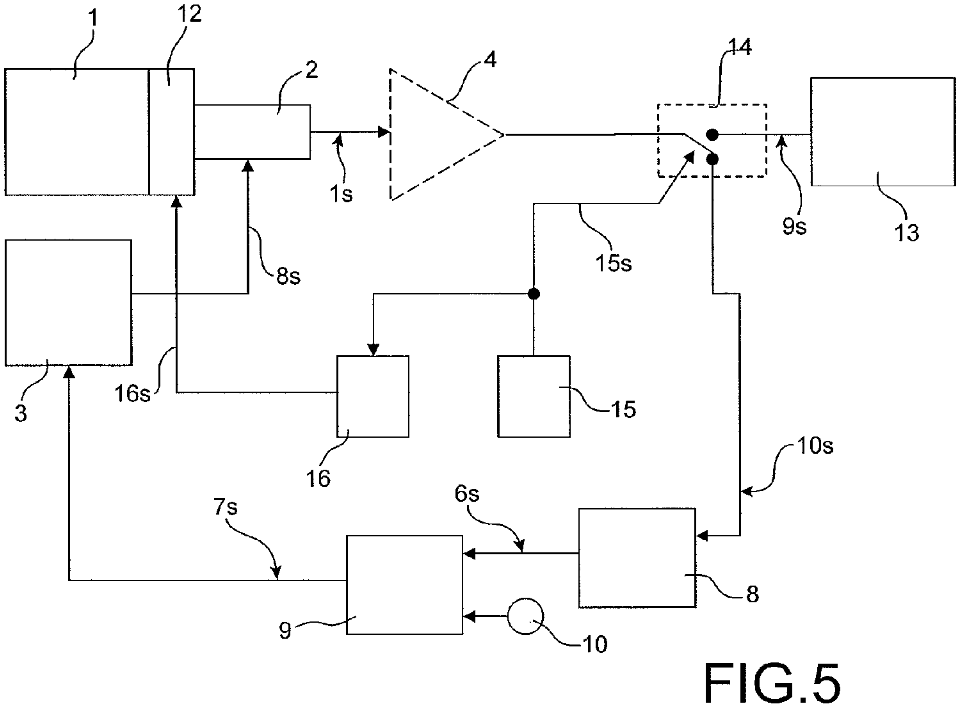
FIG. 5 represents a system for controlling photomultiplier gain drift according to a third embodiment of the invention.

FIG. 5 represents a system for controlling photomultiplier gain drift according to a third embodiment of the invention.

The output of the scintillator 1 is connected to an input of an optical switch of the Kerr effect cell type 12, one output of which is connected to the input of the photomultiplier 2. The output of the photomultiplier 2 is connected to an input of a switch 14. As mentioned above, if the signal emitted by the photomultiplier is insufficient, a preamplifier 4 is placed in series between the output of the photomultiplier and the input of the switch. Switch 14 has two outputs, of which a first output is connected to an input of a measurement chain 13, and a second output of which is connected to an input of a filter 8. An output of a clock 15 is connected, firstly, to a high-voltage adjustment unit 16 of the Kerr cell and, secondly, to the control input of the switch 14. The purpose of the clock signal transmitted from the clock 15 to the switch 14 is to control the frequency of the link between, firstly, the photomultiplier and the measuring chain 13 and, secondly, the photomultiplier and the filter 8. The output of the unit 16 is connected to a control input of the Kerr effect cell 12. Unit 16 operates in a manner similar to unit 3 and drives the Kerr effect cell according to a clock signal originating from the clock 15. An output of the filter 8 is connected to a first input of an integrator 9, a second input of which is connected to a reference voltage 10. Integrator 9 has an output connected to the high-voltage adjustment device 3, one output of which is connected to the control input of the photomultiplier 2.

Figure 6:
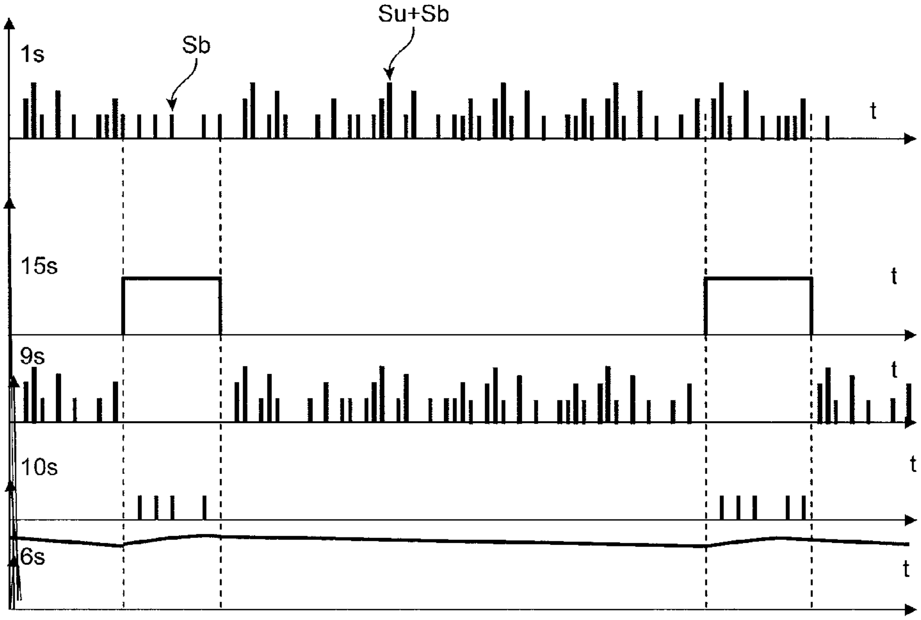
FIG. 6 represents various signals processed in a system for controlling photomultiplier gain drift in accordance with the system represented in FIG. 5.

FIG. 6 illustrates the signals is, 15*s*, 9*s*, 10*s* and 6*s* which are indicated in FIG. 5 (third embodiment of the invention).

In operation, when the photomultiplier 2 is activated, the scintillator 1 sends a useful signal Su to the Kerr cell 12, which time-slices the incident signal which it receives. After this, a first signal is including the said useful signal Su, which has been time-sliced, and the noise signal Sb originating from the photomultiplier 2, is sent from the photomultiplier 2 to the switch 14. Clock 15 drives the adjustment of switch 14 with a signal 15*s* consisting of a sequence of pulses. When a pulse arrives at switch 14, a signal 10*s* consisting solely of the noise pulses Sb which are emitted by the photomultiplier 2 is sent to the filter 8. When no pulse is supplied to the switch 14, the photomultiplier and the measuring chain 13 are electrically connected to one another and a signal 9*s* including the noise Sb and the useful signal Su is supplied to the measuring chain 13 for standard use of the signal, known per se by the man skilled in the art. Clock 15 also sends this signal 15*s* to the Kerr cell high-voltage adjustment unit 16. When a pulse is emitted from clock 15, the system according to the invention is in a period of adjustment of the high voltage, i.e. of the photomultiplier gain, and the adjustment unit applies a high voltage to the Kerr cell 16. When the clock 15 emits no pulse no adjustment is accomplished, and the measurement chain 13 measures the signal 9*s* comprising the useful signal Su and the noise signal Sb originating from the photomultiplier. Conversely, when a pulse is emitted no signal is supplied to the measuring chain 13 and, simultaneously, the signal 10*s* comprising solely the noise Sb of the photomultiplier 2 is supplied to the filter 8. The measuring period can be, for example, equal to ten minutes, and the adjustment period can be, for example, equal to one second. Subsequently, beyond filter 8, the circuit operates as described above with reference to FIG. 2*a*.

FIG. 7 shows an integrator which can be used as an integrator 35 or as an integrator 9 in the example embodiments of the invention described above. The integrator comprises an amplifier A with an inverting input (−), a non-inverting input (+) and an output. A condenser C is placed between the inverting input (−) and the output of the amplifier. A resistor R has a first terminal and a second terminal, where the first terminal is connected to the inverting input (−). The signal 6*s* is applied to the second terminal of the resistor R and the reference voltage 10 is applied to the non-inverting input (+).

FIG. 8*a* shows an example of a filter 8 known per se by the man skilled in the art. The filter 8 is connected to the output of the second switch 7 according to the configuration illustrated in FIG. 3. Filter 8 includes a resistor R having a first terminal and a second terminal. The first terminal of resistor R is connected to the second switch 7. The second terminal of the resistor R is also connected to a first terminal of a condenser C, the second terminal of which is connected to earth. The filter also includes an amplifier A having an input and an output. The input of amplifier A is connected to the second terminal of the resistor R and to the first terminal of the condenser C. The output of the amplifier is connected to the integrator 9. The filter receives the signal 5_s_ and emits the signal 6_s_.

FIG. 8_b_ shows an example of a filter 8 operating as a rectifier. This filter includes a diode D having an input and an output, and a resistor R having a first terminal and a second terminal. The output of diode D is connected to the first terminal of the resistor R, the second terminal of which is also connected to a first terminal of a condenser C. The condenser C has a second terminal which is connected to earth. The second terminal of resistor R and the first terminal of the condenser C are connected to the integrator 9. The filter receives the signal 5_s_ and emits the signal 6_s_.

The invention claimed is:

1. A system for controlling photomultiplier gain rift, the system comprising:

first means for separating an intrinsic noise pulse signal (Sb) of the photomultiplier from a useful signal (Su) output from the photomultiplier, the first means being configured to measure the intrinsic noise pulse signal, and to output a measurement signal representative of the photomultiplier's intrinsic noise pulse signal; and second means for maintaining the photomultiplier's intrinsic noise pulse signal at a constant level, based on the measurement signal, wherein the first means includes:

an integrator having an input and an output, the integrator including an amplifier connected in parallel to a condenser and a first switch; and a discriminator having an input connected to the input of the integrator, a first output of the discriminator driving the first switch and a second output of the discriminator driving a second switch, one input of the second switch being connected to the output of the integrator.

2. The system according to claim 1, wherein the second means includes a supplementary integrator having an output connected to an input of a voltage control device, wherein one output of the voltage control device is connected to a control input of the photomultiplier, and wherein the supplementary integrator has a first input connected to a reference voltage and a second input suitable for receiving the measurement signal.

3. The system according to claim 1, wherein the first means further includes a filter.

4. The system according to claim 1, wherein the first means includes a pulse and optical stretcher having an input and an output, wherein the pulse and optical stretcher is located between a scintillator and the photomultiplier, wherein the input of the pulse and optical stretcher is connected to the output of the scintillator and the output of the pulse and optical stretcher is connected to an input of the photomultiplier.

5. A method for controlling photomultiplier gain drift, comprising:

separating an intrinsic noise pulse signal of the photomultiplier from a useful signal, measuring the intrinsic noise pulse signal of the photomultiplier so as to output a measurement signal representative of the photomultiplier's noise signal; and maintaining the photomultiplier's noise signal at a constant level, based on the measurement signal; and wherein the separating and measuring is performed using a circuit comprising:

an integrator having an input and an output, the integrator including an amplifier connected in parallel to a condenser and a first switch; and a discriminator having an input connected to the input of the integrator, a first output of the discriminator driving the first switch and a second output of the discriminator driving a second switch, one input of the second switch being connected to the output of the integrator.

6. The method according to claim 5, further comprising stretching the light pulses emitted by a scintillator positioned upstream from the photomultiplier prior to measuring the intrinsic noise pulse signal.

7. The method according to claim 5, further comprising time-slicing an incident signal entering the photomultiplier prior to measuring the intrinsic noise pulse signal.

8. A system for controlling photomultiplier gain drift, the system comprising:

first means for separating an intrinsic noise pulse signal (Sb) of the photomultiplier from a useful signal (Su) output from the photomultiplier, the first means being configured to measure the intrinsic noise pulse signal and to output a measurement signal representative of the photomultiplier's intrinsic noise pulse signal; and second means for maintaining the photomultiplier's intrinsic noise pulse signal at a constant level, based on the measurement signal;

wherein the first means includes a Kerr effect cell having an input and an output, the Kerr effect cell being located between a scintillator and the photomultiplier, the input of the Kerr effect cell is connected to the output of the scintillator, the output of the Kerr effect cell is connected to an input of the photomultiplier and the output of the photomultiplier is connected to an input of a switch having two outputs, a first output of the switch is connected to an input of a measuring chain and a second output of the switch is connected to an input of the second means, an output of a clock is connected to a unit for high-voltage adjustment of the Kerr effect cell and to a control input of the switch, and the unit for high-voltage adjustment of the Kerr effect cell is connected to a control input of the Kerr effect cell.

9. A system for controlling photomultiplier gain drift according to claim 8, wherein the second means includes a supplementary integrator having an output connected to an input of a voltage control device, wherein one output of the voltage control device is connected to a control input of the photomultiplier and wherein the supplementary integrator has a first input connected to a reference voltage and a second input suitable for receiving the measurement signal.

10. A system for controlling photomultiplier gain drift according to claim 8, wherein the first means further includes a filter.

* * * * *